(12) United States Patent
Guo et al.

(10) Patent No.: US 11,823,868 B2
(45) Date of Patent: Nov. 21, 2023

(54) HARDWARE SWITCH ON MAIN FEED LINE IN A RADIO FREQUENCY PLASMA PROCESSING CHAMBER

(71) Applicant: Applied Materials, Inc., Santa Clara, CA (US)

(72) Inventors: Yue Guo, Redwood City, CA (US); Yang Yang, San Diego, CA (US); Kartik Ramaswamy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 214 days.

(21) Appl. No.: 17/346,103

(22) Filed: Jun. 11, 2021

(65) Prior Publication Data

US 2022/0399189 A1  Dec. 15, 2022

(51) Int. Cl.
*H01J 37/32* (2006.01)

(52) U.S. Cl.
CPC .. *H01J 37/32183* (2013.01); *H01J 37/32935* (2013.01); *H01J 2237/3341* (2013.01)

(58) Field of Classification Search
CPC .......... H01J 37/32183; H01J 37/32935; H01J 2237/3341
See application file for complete search history.

(56) References Cited

U.S. PATENT DOCUMENTS

| 4,246,458 | A | * | 1/1981 | Yanabu | ................ | H01H 33/664 |
| | | | | | | 106/287.17 |
| 2009/0159439 | A1 | * | 6/2009 | Pipitone | ............... | H01H 33/664 |
| | | | | | | 106/287.17 |
| 2011/0233170 | A1 | * | 9/2011 | Yamazawa | ........ | H01J 37/32174 |
| | | | | | | 204/192.1 |
| 2013/0062198 | A1 | | 3/2013 | Kouznetsov | | |
| 2018/0053633 | A1 | | 2/2018 | Glazek et al. | | |

FOREIGN PATENT DOCUMENTS

| CN | 204332820 U | * | 5/2015 |
| KR | 20190063587 A | | 6/2019 |
| WO | 2013125523 A1 | | 8/2013 |
| WO | 2021067160 A1 | | 4/2021 |

OTHER PUBLICATIONS

International Search Report for PCT/US2022/029703 dated Sep. 8, 2022.

* cited by examiner

*Primary Examiner* — Henry Luong
(74) *Attorney, Agent, or Firm* — Patterson + Sheridan, LLP

(57) ABSTRACT

Embodiments provided herein generally include apparatus, e.g., plasma processing systems, and methods for the plasma processing of a substrate in a processing chamber. Some embodiments are directed to a radio-frequency (RF) generation system. The RF generation system generally includes an RF generator, and a vacuum interrupter configured to selectively decouple the RF generator from a bias electrode of a plasma chamber based on detection of a fault condition associated with operation of the plasma chamber.

16 Claims, 5 Drawing Sheets

HARDWARE SWITCH ON MAIN FEED LINE IN A RADIO FREQUENCY PLASMA PROCESSING CHAMBER

BACKGROUND

Field

Embodiments of the present disclosure generally relate to a system used in semiconductor device manufacturing. More specifically, embodiments of the present disclosure relate to a plasma processing system used to process a substrate.

Description of the Related Art

One method of forming high aspect ratio features uses a plasma-assisted etching process to bombard a material formed on a surface of a substrate through openings formed in a patterned mask layer on a substrate surface. In a typical plasma-assisted etching process, the substrate is positioned on an electrostatic chuck (ESC) disposed in a processing chamber, a plasma is formed over the substrate, and ions are accelerated from the plasma towards the substrate across a plasma sheath, i.e., region depleted of electrons, formed between the plasma and the surface of the substrate. A radio-frequency (RF) signal may be generated by an RF generation system to maintain the sheath in the plasma chamber. In some scenarios, a fault condition may occur when providing the RF signal to the plasma chamber, which may result in damage to the RF generation system. Accordingly, there is a need in the art for an RF generation system that is able to protect system hardware from potential fault conditions and increase system safety.

SUMMARY

Embodiments provided herein generally include apparatus, e.g., plasma processing systems, and methods for the plasma processing of a substrate in a processing chamber.

Some embodiments are directed to a radio-frequency (RF) generation system. The RF generation system generally includes an RF generator, and a vacuum interrupter configured to selectively decouple the RF generator from a bias electrode of a plasma chamber based on detection of a fault condition associated with operation of the plasma chamber.

Some embodiments are directed to a method for a method for plasma processing. The method generally includes generating, via an RF generator, an RF signal provided to a bias electrode of a plasma chamber, detecting a fault condition associated with operation of the plasma chamber, and decoupling, via a vacuum interrupter, the RF generator from the bias electrode of the plasma chamber based on the detection of the fault condition.

Some embodiments are directed to an apparatus for plasma processing. The apparatus generally includes means for generating an RF signal provided to a bias electrode of a plasma chamber, means for detecting a fault condition associated with operation of the plasma chamber, and a vacuum interrupter configured to decouple a first RF generator from the bias electrode of the plasma chamber based on the detection of the fault condition

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

DETAILED DESCRIPTION

Certain aspects of the present disclosure are generally directed to a radio-frequency (RF) generation system implemented using a hardware switch. The hardware switch may be implemented as a vacuum interrupter to facilitate decoupling of an RF generator from a complex load disposed within a plasma processing chamber in an attempt to increase system safety and prevent damage to the RF generation system. A controller may be used to control the hardware switch to decouple the RF generator from the plasma generator upon detection of a fault or reflected power that would otherwise cause damage to the RF generation system. For example, upon detection of a sudden change in voltage, current, or impedance, the hardware switch may be opened. The vacuum interrupter provides various benefits, including hardware protection from fault conditions and increasing safety by isolating the RF generator from the plasma processing chamber during maintenance. Due to the hardware switch operating in a vacuum, the vacuum interrupter provides a well-defined arcing point upon opening the hardware switch, helping to avoid potential damage to components within the RF generation system and other systems found within the plasma processing chamber.

Plasma Processing System Examples

Figure 1:
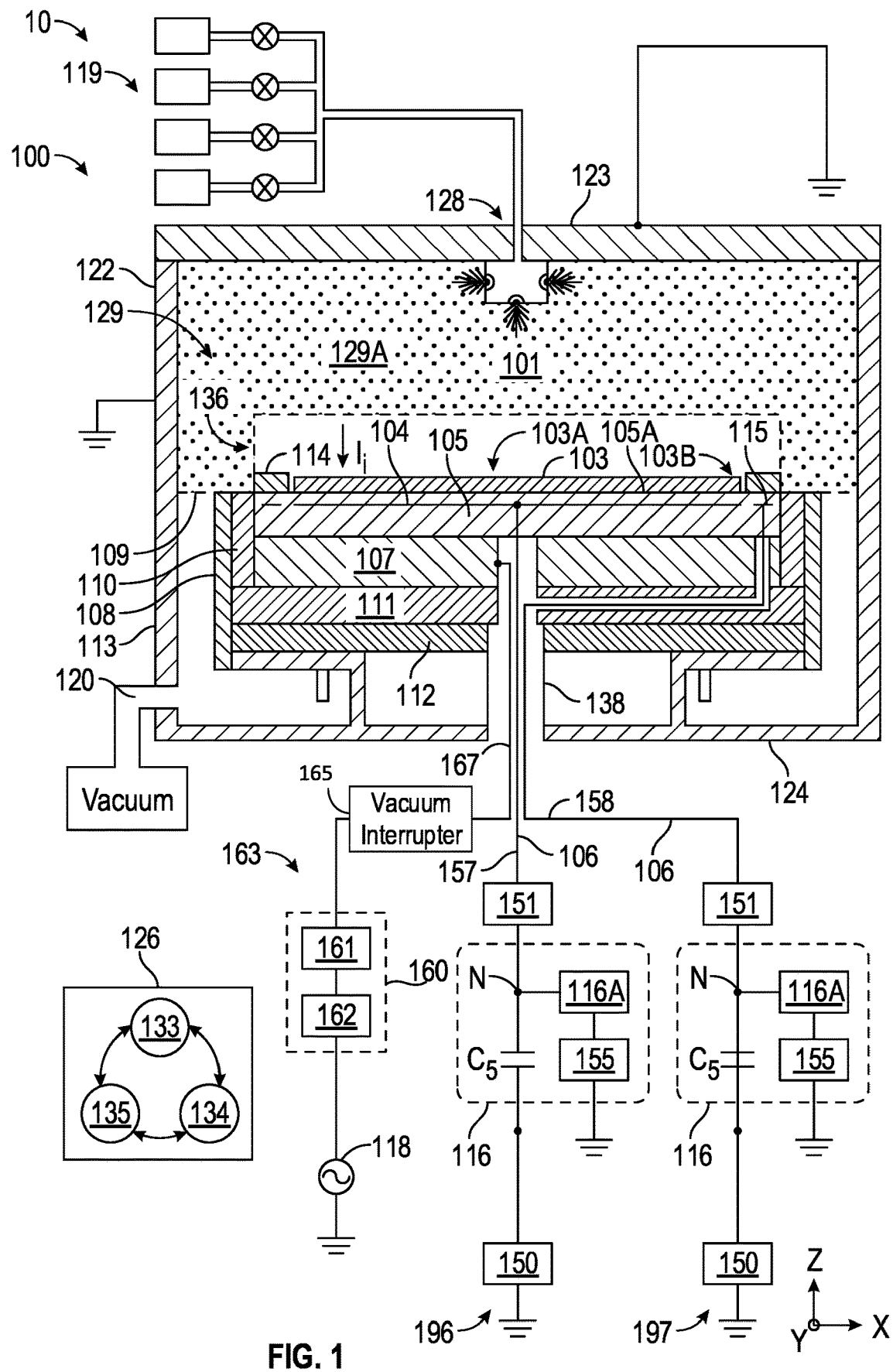
FIG. 1 is a schematic cross-sectional view of a processing system, according to one or more embodiments, configured to practice the methods set forth herein.

FIG. 1 is a schematic cross-sectional view of a processing system 10 configured to perform one or more of the plasma processing methods set forth herein. In some embodiments, the processing systems 10 is configured for plasma-assisted etching processes, such as a reactive ion etch (RIE) plasma processing. However, it should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

As shown, the processing system 10 is configured to form a capacitively coupled plasma (CCP), where the processing chamber 100 includes an upper electrode (e.g., chamber lid 123) disposed in a processing volume 129 facing a lower electrode (e.g., the substrate support assembly 136) also disposed in the processing volume 129. In a typical capacitively coupled plasma (CCP) processing system, a radio frequency (RF) source (e.g., RF generator 118) is electrically coupled to one of the upper or lower electrode, and delivers an RF signal configured to ignite and maintain a plasma (e.g., the plasma 101). In this configuration, the plasma is capacitively coupled to each of the upper and lower electrodes and is disposed in a processing region therebetween. Typically, the opposing one of the upper or lower electrodes is coupled to ground or to a second RF power source. One or more components of the substrate support assembly 136, such as the support base 107 is electrically coupled to a plasma generator assembly 163, which includes the RF generator 118, and the chamber lid 123 is electrically coupled to ground. As shown, the processing system 10 includes a processing chamber 100, a support assembly 136, and a system controller 126.

The processing chamber 100 typically includes a chamber body 113 that includes the chamber lid 123, one or more sidewalls 122, and a chamber base 124, which collectively define the processing volume 129. The one or more sidewalls 122 and chamber base 124 generally include materials that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy.

A gas inlet 128 disposed through the chamber lid 123 is used to deliver one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103.

The system controller 126, also referred to herein as a processing chamber controller, includes a central processing unit (CPU) 133, a memory 134, and support circuits 135. The system controller 126 is used to control the process sequence used to process the substrate 103, including the substrate biasing methods described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing system 10.

Typically, the program, which is readable by CPU 133 in the system controller 126, includes code, which, when executed by the processor (CPU 133), performs tasks relating to the plasma processing schemes described herein. The program may include instructions that are used to control the various hardware and electrical components within the processing system 10 to perform the various process tasks and various process sequences used to implement the methods described herein. In one embodiment, the program includes instructions that are used to perform one or more of the operations described below in relation to FIG. 5.

The processing system may include a plasma generator assembly 163, a first pulsed voltage (PV) source assembly 196 for establishing a first PV waveform at a bias electrode 104, and a second PV source assembly 197 for establishing a second PV waveform at an edge control electrode 115. In some embodiments, the plasma generator assembly 163 delivers an RF signal to the support base 107 (e.g., power electrode or cathode) which may be used to generate (maintain and/or ignite) a plasma 101 in a processing region 129A disposed between the substrate support assembly 136 and the chamber lid 123. In some embodiments, the RF generator 118 is configured to deliver an RF signal having a frequency that is greater than 1 MHz or more, or about 2 MHz or more, such as about 13.56 MHz or more.

As discussed above, in some embodiments, the plasma generator assembly 163, which includes an RF generator 118 and an RF generator assembly 160, is generally configured to deliver a desired amount of a continuous wave (CW) or pulsed RF power at a desired substantially fixed sinusoidal waveform frequency to a support base 107 of the substrate support assembly 136 based on control signals provided from the system controller 126. During processing, the plasma generator assembly 163 is configured to deliver RF power (e.g., an RF signal) to the support base 107 disposed proximate to the substrate support 105, and within the substrate support assembly 136. The RF power delivered to the support base 107 is configured to ignite and maintain a processing plasma 101 of processing gases disposed within the processing volume 129. Alternately, in some embodiments, the first pulsed voltage (PV) source assembly 196 and the plasma generator assembly 163 are configured to deliver a first PV waveform and an RF signal, respectively, to the bias electrode 104 of the substrate support assembly 136 during processing.

In some embodiments, the support base 107 is an RF electrode that is electrically coupled to the RF generator 118 via an RF matching circuit 162 and a first filter assembly 161, which are both disposed within the RF generator assembly 160. The first filter assembly 161 includes one or more electrical elements that are configured to substantially prevent a current generated by the output of a PV waveform generator 150 from flowing through an RF power delivery line 167 and damaging the RF generator 118. The first filter assembly 161 acts as a high impedance (e.g., high Z) to the PV signal generated from a PV pulse generator P1 within the PV waveform generator 150, and thus inhibits the flow of current to the RF matching circuit 162 and RF generator 118.

In some embodiments, the RF generator assembly 160 and RF generator 118 are used to ignite and maintain a processing plasma 101 using the processing gases disposed in the processing volume 129 and fields generated by the RF power (RF signal) delivered to the support base 107 by the RF generator 118. The processing volume 129 is fluidly coupled to one or more dedicated vacuum pumps through a vacuum outlet 120, which maintain the processing volume 129 at sub-atmospheric pressure conditions and evacuate processing and/or other gases, therefrom. In some embodiments, the substrate support assembly 136, disposed in the processing volume 129, is disposed on a support shaft 138 that is grounded and extends through the chamber base 124. However, in some embodiments, the RF generator assembly 160 is configured to deliver an RF power to the bias electrode 104 disposed in the substrate support 105 versus the support base 107.

As described, in some embodiments, RF source power (e.g., from RF generator 118) for plasma production is delivered to an RF baseplate (the support base 107) within the cathode assembly, whereas a top electrode of the assembly is grounded. The frequency of the RF source can be from 13.56 MHz to a high frequency band such as 60 MHz, 120 MHz, or 162 MHz. In some examples, the RF source power can also be delivered through the top electrodes. The source power may be operated in a pulsed mode, in some embodiments. The pulsing frequency may be from 100 kHz to 5 kHz and the duty cycle may range from 5% to 95%. A bias power may be applied to the bottom electrode with a frequency range from 100 kHz to 20 MHz. The bias power may be operated in either a continuous or a pulsed mode. In some embodiments, there may also be a third electrode (e.g., edge control electrode 115) at the edge of the cathode assembly for edge uniformity control. In some embodiments of the present disclosure, a switch 165 may be implemented between the RF generator 118 and the processing chamber 100 for hardware protection and industrial safety.

The substrate support assembly 136, as briefly discussed above, generally includes the substrate support 105 (e.g., ESC substrate support) and support base 107. In some embodiments, the substrate support assembly 136 can additionally include an insulator plate 111 and a ground plate 112, as is discussed further below. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing.

Typically, the substrate support 105 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes the bias electrode 104 embedded in the dielectric material thereof. In some embodiments, one or more characteristics of the RF power used to maintain the plasma 101 in the processing region over the bias electrode 104 are determined and/or monitored by measuring an RF waveform established at the bias electrode 104.

In one configuration, the bias electrode 104 is a chucking pole used to secure (i.e., chuck) the substrate 103 to the substrate supporting surface 105A of the substrate support 105 and to bias the substrate 103 with respect to the processing plasma 101 using one or more of the pulsed-voltage biasing schemes described herein. Typically, the bias electrode 104 is formed of one or more electrically conductive parts, such as one or more metal meshes, foils, plates, or combinations thereof.

In some embodiments, the bias electrode 104 is electrically coupled to a clamping network 116, which provides a chucking voltage thereto, such as static DC voltage between about −5000 V and about 5000 V, using an electrical conductor, such as the coaxial power delivery line 106 (e.g., a coaxial cable). As will be discussed further below, the clamping network 116 includes bias compensation circuit elements 116A, a DC power supply 155, and a bias compensation module blocking capacitor, which is also referred to herein as the blocking capacitor $C_5$. The blocking capacitor $C_5$ is disposed between the output of a pulsed voltage (PV) waveform generator 150 and the bias electrode 104.

The substrate support assembly 136 may further include the edge control electrode 115 that is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. In some embodiments, such as shown in FIG. 1, the edge control electrode 115 is positioned within a region of the substrate support 105. In some embodiments, as illustrated in FIG. 1, the edge control electrode 115 includes a conductive mesh, foil, and/or plate that is disposed a similar distance (i.e., Z-direction) from the substrate supporting surface 105A of the substrate support 105 as the bias electrode 104. In some other embodiments, the edge control electrode 115 includes a conductive mesh, foil, and/or plate that is positioned on or within a region of a quartz pipe 110, which surrounds at least a portion of the bias electrode 104 and/or the substrate support 105. Alternately, in some other embodiments (not shown), the edge control electrode 115 is positioned within or is coupled to the edge ring 114, which is disposed on and adjacent to the substrate support 105. In this configuration, the edge ring 114 is formed from a semiconductor or dielectric material (e.g., AlN, etc.).

The edge control electrode 115 can be biased by use of a PV waveform generator that is different from the PV waveform generator 150 that is used to bias the bias electrode 104. In some embodiments, the edge control electrode 115 can be biased by use of a PV waveform generator 150 that is also used to bias the bias electrode 104 by splitting part of the power to the edge control electrode 115. In one configuration, a first PV waveform generator 150 of the first PV source assembly 196 is configured to bias the bias electrode 104, and a second PV waveform generator 150 of a second PV source assembly 197 is configured to bias the edge control electrode 115.

A power delivery line 157 electrically connects the output of the PV waveform generator 150 of the first PV source assembly 196 to an optional filter assembly 151 and the bias electrode 104. While the discussion below primarily discusses the power delivery line 157 of the first PV source assembly 196, which is used to couple a PV waveform generator 150 to the bias electrode 104, the power delivery line 158 of the second PV source assembly 197, which couples a PV waveform generator 150 to the edge control electrode 115, will include the same or similar components. The electrical conductor(s) within the various parts of the power delivery line 157 may include: (a) one or a combination of coaxial cables, such as a flexible coaxial cable that is connected in series with a rigid coaxial cable, (b) an insulated high-voltage corona-resistant hookup wire, (c) a bare wire, (d) a metal rod, (e) an electrical connector, or (f) any combination of electrical elements in (a)-(e). The optional filter assembly 151 includes one or more electrical elements that are configured to substantially prevent a current generated by the output of the RF generator 118 from flowing through the power delivery line 157 and damaging the PV waveform generator 150. The optional filter assembly 151 acts as a high impedance (e.g., high Z) to RF signal generated by the RF generator 118, and thus inhibits the flow of current to the PV waveform generator 150.

The second PV source assembly 197 includes a clamping network 116 so that a bias applied to the edge control electrode 115 can be similarly configured to the bias applied to the bias electrode 104 by the clamping network 116 coupled within the first PV source assembly 196. Applying similarly configured PV waveforms and clamping voltages to the bias electrode 104 and edge control electrode 115 can help improve the plasma uniformity across the surface of the substrate during processing and thus improve the plasma processing process results.

In some embodiments, the processing chamber 100 further includes the quartz pipe 110, or collar, that at least partially circumscribes portions of the substrate support assembly 136 to prevent the substrate support 105 and/or the support base 107 from contact with corrosive processing gases or plasma, cleaning gases or plasma, or byproducts thereof. Typically, the quartz pipe 110, the insulator plate 111, and the ground plate 112 are circumscribed by a liner 108. In some embodiments, a plasma screen 109 is positioned between the cathode liner 108 and the sidewalls 122 to prevent plasma from forming in a volume underneath the plasma screen 109 between the liner 108 and the one or more sidewalls 122.

Example Radio-Frequency (RF) Signal Generation System

Certain aspects of the present disclosure are directed to techniques for hardware protection and industrial safety by using a hardware switch in a radio frequency (RF) plasma processing system. For example, referring back to FIG. 1, a hardware switch 165 may be configured to decouple the RF generator 118 from the plasma assembly upon detection of a fault condition in an attempt to prevent damage to the RF generation system.

On example type of fault condition may include RF reflected power. RF reflected power may be monitored by elements within the system controller to protect against sudden impedance changes in a process chamber. When high reflected power or other faults are detected for a certain period (e.g., 5 seconds), a system safety interlock loop may be activated and an interlock signal (e.g. from the system controller 126) may be sent to the RF generator 118 to shut the RF generator off. However, the high reflected power may still cause damage to the RF power generator, especially when incorporating the RF generator together with a pulsed voltage generator. The hardware switch 165 provides for a means to decouple the RF generator 118 from the plasma assembly to prevent damage to the RF generation system.

In some embodiments, the hardware switch 165 may be implemented as a vacuum interrupter. A vacuum interrupter is a switch which uses electrical contacts that are disposed in a vacuum environment. In some embodiments, the switch is disposed within a region that is enclosed by electrical shielding that may be coupled to ground. Opening the switch of the vacuum interrupter facilitates a fast disconnect of RF power delivered from the RF generation system.

The vacuum interrupter hardware switch has various benefits. For example, the hardware switch can physically disconnect the main RF feed line for protection, in addition to a software-controlled switch to shut off the RF generator. The vacuum interrupter hardware switch also provides extra protection to the system to prevent damages caused by overloads or short circuits. The hardware switch can also enhance safety during times where system maintenance and diagnostics are to be performed. For instance, during maintenance, the hardware switch 165 of the vacuum interrupter may be opened such that maintenance workers are not exposed to the high voltage from the RF generator 118.

Moreover, the hardware switch 165 can help to interrupt power in a safe, reliable and repeatable way. By separating two switch electrodes (e.g., electrodes 302, 304 in FIG. 3) in a vacuum, a potential arcing point between the electrodes upon disconnect is well defined within the switch itself, which can help to avoid potential damages anywhere else in the system. In other words, the arc caused by the opening of the hardware switch may be desirably formed between an electrode of the switch and a vacuum enclosure of the vacuum interrupter versus between electrodes of the switch or between an electrode and other components. Thus, the vacuum interrupter provides a well-defined arcing point to the vacuum enclosure, helping to avoid potential damage to components within the RF generation system and other systems found within the plasma processing chamber. Also, under normal process conditions, the switch can carry the full load of the RF current. In some examples, vacuum interrupters can be well sealed in a ceramic vessel with a pressure less than 1 Pa, which can improve dielectric strength, provide rapid dielectric recovery rate, and increase reliability.

In addition, the vacuum interrupter hardware switch offers insulating strength and a fast recovery rate for an improved arc quenching capability. The reliable and low maintenance hardware switch has a long service life and is suitable for repeated operations.

As another advantage, the switch logic and motion can be user-defined and tied to a system interlock loop. For example, once a fault or an unexpected voltage, current, or impedance change is detected, the hardware switch may interrupt RF power within a fast time scale (e.g., within a few milliseconds).

Figure 2:
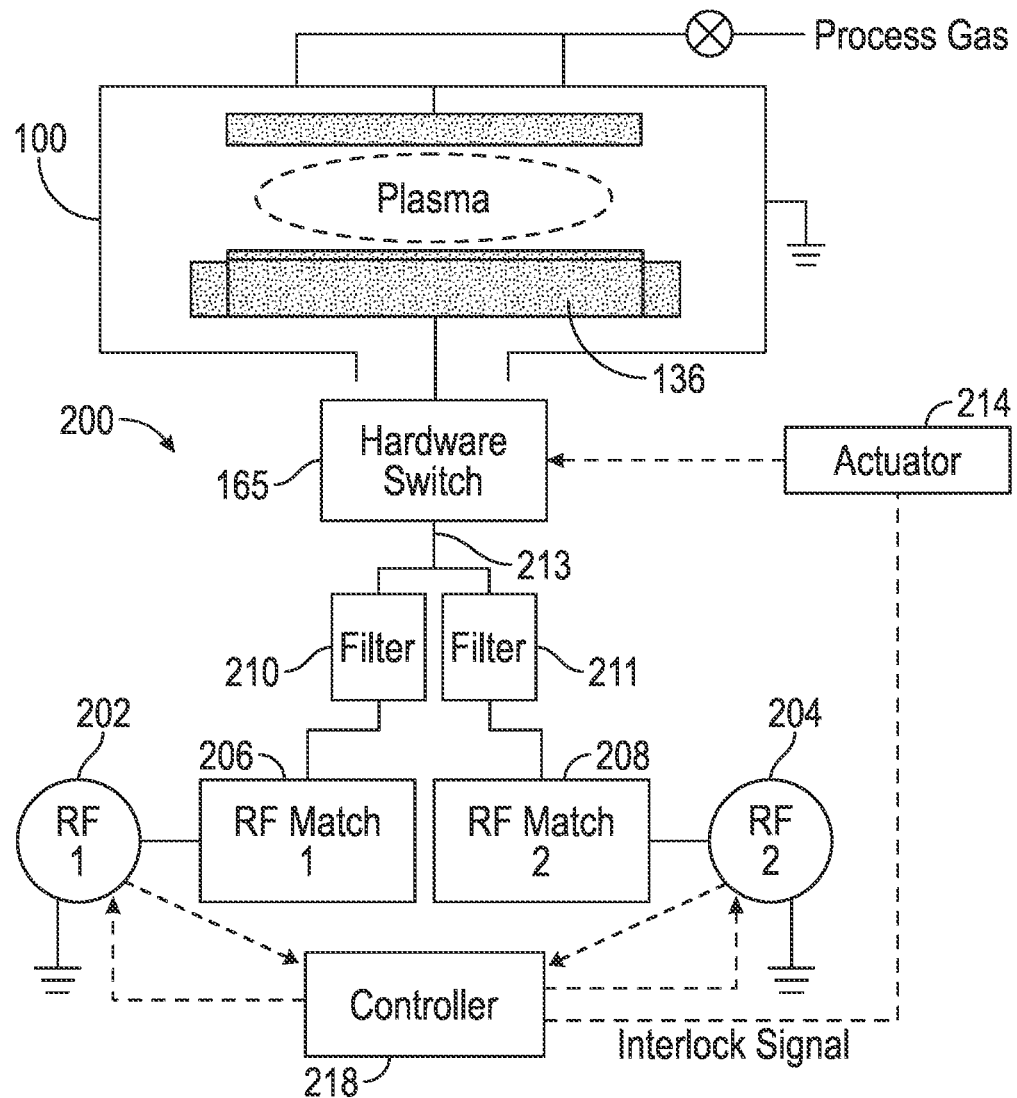
FIG. 2 illustrates a radio-frequency (RF) generation system, in accordance with certain aspects of the present disclosure.

FIG. 2 illustrates an RF generation system 200, in accordance with certain aspects of the present disclosure. For ease of discussion, the first PV source assembly 196 and second PV source assembly 197 components have been omitted from FIG. 2. The RF generation system 200 can form part of the plasma generator assembly 163 illustrated in FIG. 1. While a single RF generator 118 is illustrated in FIG. 1, power from multiple RF generators may be combined in some cases. For example, as shown in FIG. 2, the RF generation system 200 includes RF generators 202, 204. The output of each of the RF generators 202, 204 may be coupled to an RF impedance matching network 206, 208 (e.g., corresponding to RF matching circuit 162). The RF filters 210, 211 thus form part of the filter assembly 161 (FIG. 1) and the RF matching networks 206, 208 form part of the RF matching circuit 162 (FIG. 1). An RF impedance matching network is an electrical circuit used between an RF generator and a plasma reactor to improve power delivery efficiency. At a tuned matching point, maximum power is delivered into a plasma load and near zero power is reflected to the RF generation system. As shown, RF filters 210, 211 may be coupled to the output of the RF matching networks 206, 208. In order to combine different RF powers from the RF generators 202, 204 to the cathode in the chamber assembly, RF filters 210, 211 may be used between the RF matching circuits and the chamber assembly. The RF filters 210, 211 may be designed to allow pass-through of RF powers in a selected frequency range (e.g., including the frequency associated with a respective one of the RF generators 202, 204) and to isolate the RF generators from each other. As shown, outputs of the RF filters 210, 211 are coupled to a common node 213 to combine the RF powers from the RF generators.

As described, to reduce potential hazards and system damages, a hardware switch 165 may be included on the main feed line (e.g., RF power delivery line 167). As shown, the hardware switch 165 is installed at the output of the RF filters 210, 211. An actuator 214 may be used to operate a moving part in the hardware switch 165 that allows the RF power to be selectively coupled and decoupled by use of commands from a controller 218. In some embodiments, as shown in FIG. 2, the hardware switch 165 and main feed line are coupled between one or more electrodes disposed within the substrate support assembly 136 and one or both of the RF generators 202, 204.

As shown, the RF generation system 200 may include a system controller 218, which forms part of the system controller 126. When a fault is captured by the system controller 218, an interlock signal may be sent to both the RF generators 202, 204 and the actuator 214. The actuator 214 can then operate to open the hardware switch 165, and the RF generators 202, 204 will begin to turn off. In some configurations, it may be desirable to provide more hardware switches at the RF generator outputs, matching circuit outputs, and/or other locations on the RF feed line(s) to increase reliability.

Figure 3:
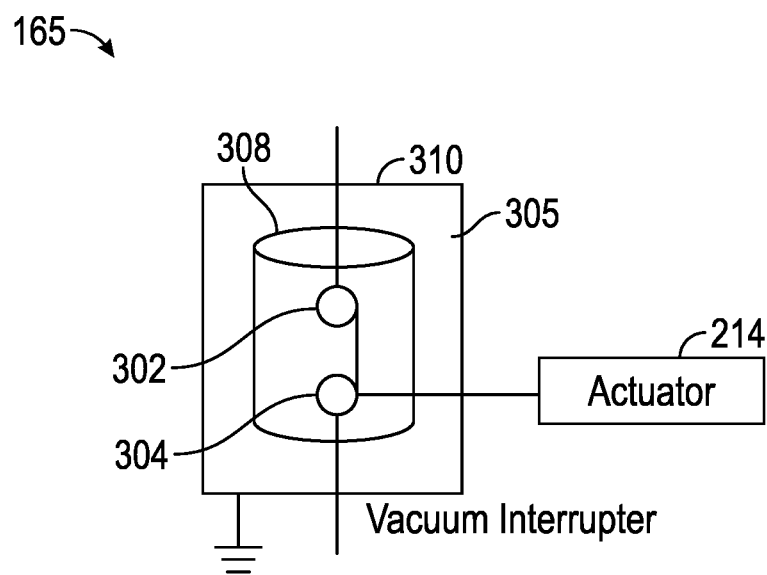
FIG. 3 illustrates an implementation of a hardware switch using a vacuum interrupter.

FIG. 3 illustrates an implementation of the hardware switch 165 using a vacuum interrupter. In some embodiments, the vacuum interrupter acts as a breaker that includes at least one fixed electrode (e.g., electrode 302), a movable electrode (e.g., electrode 304) and a ceramic vessel used as a vacuum housing 308 and an outer insulating body (e.g., metal enclosure 310). The electrode 302 and movable electrode 304 may be formed from a refractory metal or other useful material that are able to repeatedly form a reliable electrical contact. The vacuum interrupter is placed in an enclosed region 305 within the metal enclosure 310, which is connected to common ground as a RF current return path. The metal enclosure 310 will help to safely isolate the RF powered components from a user, and minimize any additional RF generated electromagnetic interference and control stray capacitances formed by the addition of the hardware switch 165 within the processing system. The movable electrode 304 can be pulled away or separated from the fixed electrode 302 by an actuator 214, which is controlled by the system controller 218 described with respect to FIG. 2. When receiving a safety interlock signal from the system controller 218, the actuator disconnects (e.g., pulls apart) the two mating electrodes to interrupt the delivery of the RF power. The actuator 214 may be operated by either a magnetic or pneumatic mechanism. A pneumatic actuator can be used inside or outside the RF environment. A magnetic actuator may be placed outside the RF environment to avoid RF interference to the actuator solenoid. The outer metal enclosure provides a return path for RF currents, and is connected to the chamber common ground. RF current flows through the electrodes to the processing chamber, and returns on the inner surface of the metal enclosure.

In some embodiments, detection of a fault condition may involve detection of a sudden change in voltage (e.g., a sudden change in voltage at common node 213) or current to or from the processing chamber 100. In some embodiments, a sudden change in impedance associated with an RF matching circuit may indicate a fault condition, as described in more detail with respect to FIG. 4.

Figure 4:
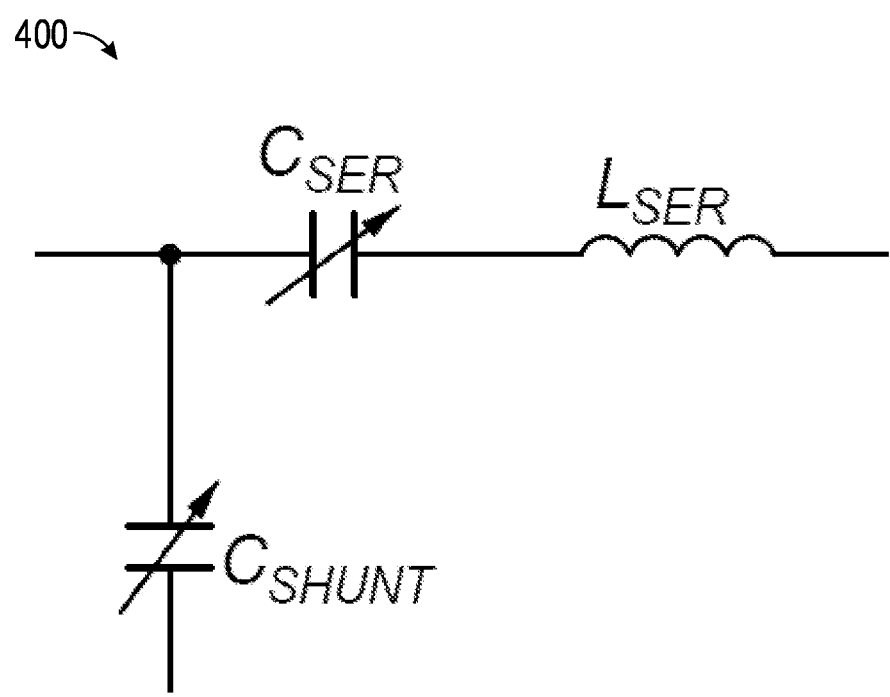
FIG. 4 illustrates an example RF matching circuit.

FIG. 4 illustrates an example RF matching circuit 400 (e.g., corresponding to RF matching network 206 or 208). As shown, the RF matching circuit 400 includes a series inductance element $L_{SER}$, an adjustable series capacitance element $C_{SER}$, and an adjustable shunt capacitance element $C_{SHUNT}$ that can be controlled by input from the controller 218. In some embodiments, the RF matching circuit 400 may alternately be formed by use of other circuit element configurations, such as L network, pi network, or transmatch circuits, for example. The RF matching circuit 400 is generally configured to tune the apparent load of the associated RF generator to 50Ω to reduce the reflected power generated by the delivery of the RF signal from the RF generator and increase its power delivery efficiency. In some aspects, a fault condition may be detected by detection of a sudden change in the capacitance associated with the adjustable shunt capacitance element $C_{SHUNT}$ (and/or the adjustable series capacitance element $C_{SER}$).

Figure 5:
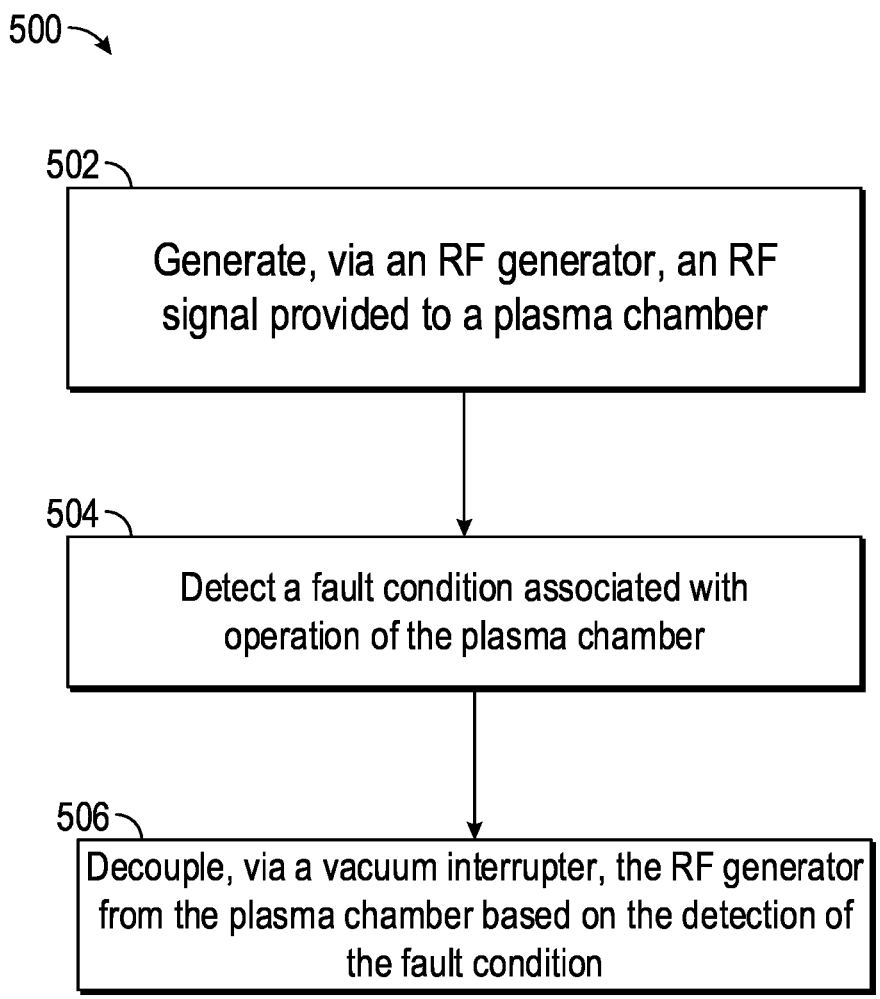
FIG. 5 is a process flow diagram illustrating a method for plasma processing, in accordance with certain embodiments of the present disclosure.

FIG. 5 is a process flow diagram illustrating a method 500 of plasma processing, in accordance with certain embodiments of the present disclosure. The method 500 may be performed by an RF generation system, such as the RF generation system 200.

At activity 502, the RF generation system generates (e.g., via RF generator 118 or RF generator 202) an RF signal provided to a bias electrode (e.g., bias electrode 104) of a plasma chamber (e.g., plasma chamber 100).

At activity 504, The RF generation system detects a fault condition associated with operation of the plasma chamber. For example, detecting the fault condition may include detecting a change in a voltage on a RF feedline (e.g., RF power delivery line 167) between the RF generator and the plasma chamber, or detecting a change in a current between the RF generator and the plasma chamber. In some embodiments, detecting the fault condition may include detecting a change in impedance (e.g., change in capacitance of $C_{Shunt}$ or $C_{SER}$) associated with a RF matching network (e.g., RF matching network 206) coupled between the RF generator and the plasma chamber. In some embodiments, detecting the fault condition may include detecting the opening of a processing chamber 100 cover, emergency stop button and/ or other command sent from the controller 218.

At activity 506, the RF generation system may decouple (e.g., via a hardware switch 165 implemented as a vacuum interrupter) the RF generator from the plasma chamber based on the detection of the fault condition. For example, decoupling the RF generator may include opening the hardware switch of the vacuum interrupter based on the detection of the fault condition. In some aspects, the RF generation system and/or controller 218 also turns off the RF generator based on the detection of the fault condition.

In some embodiments, the RF generator is decoupled from the plasma chamber by controlling an actuator (e.g., actuator 214) for the vacuum interrupter. The vacuum interrupter may include a first electrode (e.g., electrode 302) disposed in a vacuum housing (e.g., vacuum housing 308), and a second electrode (e.g., electrode 304) disposed in the vacuum housing. In some embodiments, decoupling the RF generator from the plasma chamber includes decoupling the first electrode from the second electrode based on the detection of the fault condition. In some embodiments, the vacuum interrupter further includes a metal enclosure (e.g., metal enclosure 310) at least partially around the vacuum housing, the metal enclosure being coupled to ground.

In some embodiments, the RF generation system may filter (e.g., via filter 210) the RF signal generated by the RF generator. The RF generation system may also generate (e.g., via RF generator 204) another RF signal, and filter the other RF signal (e.g., via filter 211). The filtered RF signal and the filtered other RF signal may be combined and provided to the processing chamber through the vacuum interrupter.

The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object.

No claim element is to be construed under the provisions of 35 U.S.C. § 112(f) unless the element is expressly recited using the phrase "means for" or, in the case of a method claim, the element is recited using the phrase "step for." In some embodiments, means for generating an RF signal may include an RF generator such as the RF generator 118, RF generator 202, or RF generator 204, and means for detecting may include a controller, such as the controller 126 or controller 218.

While the foregoing is directed to embodiments of the present disclosure, other and further embodiments of the disclosure may be devised without departing from the basic scope thereof, and the scope thereof is determined by the claims that follow.

What is claimed is:

1. A radio-frequency (RF) generation system, comprising:
a first RF generator; and
a vacuum interrupter comprising
a first electrode disposed in a vacuum housing,
a second electrode disposed in the vacuum housing, and
a metal enclosure coupled to ground and at least partially around the vacuum housing;
the vacuum interrupter configured to selectively decouple the first RF generator from a bias electrode of a plasma chamber based on detection of a fault condition associated with operation of the plasma chamber by decoupling the first electrode from the second electrode.

2. The RF generation system of claim 1, further comprising a controller configured to:
detect the fault condition; and
control the selective decoupling of the first RF generator from the bias electrode by the vacuum interrupter based on the detection.

3. The RF generation system of claim 2, wherein the controller is further configured to
turn off the first RF generator based on the detection of the fault condition.

4. The RF generation system of claim 2, further comprising an actuator configured to control the vacuum interrupter, wherein the controller is configured to control the vacuum interrupter via the actuator.

5. The RF generation system of claim 4, wherein the actuator comprises a pneumatic actuator or a magnetic actuator.

6. The RF generation system of claim 2, wherein the controller is configured to detect the fault condition based on at least one of:
a voltage on a RF feedline between the first RF generator and the bias electrode of the plasma chamber; or
a current between the first RF generator and the plasma chamber.

7. The RF generation system of claim 2, further comprising an RF matching network coupled between the first RF generator and the plasma chamber, wherein the controller is configured to detect the fault condition by detecting a change in impedance associated with the RF matching network.

8. The RF generation system of claim 1, further comprising:
a first filter coupled between the first RF generator and the vacuum interrupter;
a second RF generator; and
a second filter coupled between the second RF generator and the vacuum interrupter.

9. The RF generation system of claim 8, further comprising:
an RF matching circuit coupled between the first RF generator and the first filter; and
another RF matching circuit coupled between the second RF generator and the second filter.

10. A method for plasma processing, comprising:
generating, via a first RF generator, an RF signal provided to a bias electrode of a plasma chamber;
detecting a fault condition associated with operation of the plasma chamber; and
decoupling, via a vacuum interrupter, the first RF generator from the bias electrode of the plasma chamber based on the detection of the fault condition;
the vacuum interrupter comprising
a first electrode disposed in a vacuum housing,
a second electrode disposed in the vacuum housing, and
a metal enclosure coupled to ground and at least partially around the vacuum housing;
wherein decoupling the first RF generator from the bias electrode of the plasma chamber comprises decoupling the first electrode from the second electrode based on the detection of the fault condition.

11. The method of claim 10,
further comprising turning off the first RF generator based on the detection of the fault condition.

12. The method of claim 10, wherein the first RF generator is decoupled from the bias electrode of the plasma chamber by controlling an actuator for the vacuum interrupter.

13. The method of claim 10, wherein detecting the fault condition comprises:
detecting a change in a voltage on a RF feedline between the first RF generator and the plasma chamber; or
detecting a change in a current between the first RF generator and the bias electrode of the plasma chamber.

14. The method of claim 10, wherein detecting the fault condition comprises detecting a change in impedance associated with a RF matching network coupled between the first RF generator and the bias electrode of the plasma chamber.

15. The method of claim 10, further comprising:
filtering the RF signal generated by the first RF generator;
generating, via a second RF generator, another RF signal; and
filtering the other RF signal, wherein the filtered RF signal and the filtered other RF signal are combined and provided to the bias electrode of the plasma chamber through the vacuum interrupter.

16. A method for plasma processing, comprising:
generating, via a first RF generator, an RF signal provided to a bias electrode of a plasma chamber;
detecting a fault condition associated with operation of the plasma chamber; and
decoupling, via a vacuum interrupter, the first RF generator from the bias electrode of the plasma chamber based on the detection of the fault condition;

filtering the RF signal generated by the first RF generator;
generating, via a second RF generator, another RF signal; and
filtering the other RF signal, wherein the filtered RF signal and the filtered other RF signal are combined and provided to the bias electrode of the plasma chamber through the vacuum interrupter.

* * * * *